(12) United States Patent
Watanabe et al.

(10) Patent No.: US 11,776,112 B2
(45) Date of Patent: Oct. 3, 2023

(54) MISALIGNMENT MEASURING APPARATUS AND MISALIGNMENT MEASURING METHOD

(71) Applicant: Kioxia Corporation, Tokyo (JP)

(72) Inventors: Yuki Watanabe, Yokohama (JP); Kazuhiro Nojima, Mie (JP)

(73) Assignee: Kioxia Corporation, Tokyo (JP)

( * ) Notice: Subject to any disclaimer, the term of this patent is extended or adjusted under 35 U.S.C. 154(b) by 379 days.

(21) Appl. No.: 17/202,666

(22) Filed: Mar. 16, 2021

(65) Prior Publication Data

US 2022/0012863 A1    Jan. 13, 2022

(30) Foreign Application Priority Data

Jul. 9, 2020 (JP) ................................. 2020-118338

(51) Int. Cl.
*G06K 9/00* (2022.01)
*G06T 7/00* (2017.01)
(Continued)

(52) U.S. Cl.
CPC .......... *G06T 7/001* (2013.01); *G03F 7/70633* (2013.01); *G03F 9/7092* (2013.01);
(Continued)

(58) Field of Classification Search
CPC ..... G06T 7/0002; G06T 7/0004; G06T 7/001; G06T 7/10; G06T 7/50; G06T 7/60; G06T 7/66; G06T 7/70; G06T 7/97; G06T 2207/10061; G06T 2207/30108; G06T 2207/30141; G06T 2207/30148; G06V 10/22; G06V 10/225; G06V 10/245; G06V 10/28; H01L 21/67253; H01L 21/67259; H01L 21/67288; H01L 21/68; H01L 21/681; H01L 21/682; H01L 22/12;
(Continued)

(56) References Cited

U.S. PATENT DOCUMENTS 5,840,595 A * 11/1998 Kobayashi ................ G06T 7/80
438/16
9,390,885 B2    7/2016 Yamamoto et al.
(Continued)

FOREIGN PATENT DOCUMENTS

JP         4274649 B2    6/2009
JP      2013-168595 A    8/2013
(Continued)

*Primary Examiner* — Eric Rush
(74) *Attorney, Agent, or Firm* — Oblon, McClelland, Maier & Neustadt, L.L.P.

(57) ABSTRACT

According to one embodiment, a misalignment measuring apparatus includes: an input circuit; a storage medium; a first circuit configured to, in a first calibration pattern, calculate a second misalignment amount; a second circuit configured to, using a first image of a second calibration pattern, calculate a third misalignment amount; a third circuit configured to calculate a coefficient indicating; and a fourth circuit configured to, using a second image corresponding to the first and second patterns, calculate a third center position of a third contour and calculate the first misalignment amount between the first pattern and the second pattern based on the fourth misalignment amount and the coefficient.

16 Claims, 9 Drawing Sheets

(51) Int. Cl.
  G06T 7/70 (2017.01)
  G06T 7/60 (2017.01)
  G06V 10/28 (2022.01)
  H05K 3/46 (2006.01)
  G06T 7/10 (2017.01)
  H01L 21/68 (2006.01)
  H01L 21/67 (2006.01)
  G03F 9/00 (2006.01)
  G03F 7/00 (2006.01)

(52) U.S. Cl.
  CPC .................. G06T 7/10 (2017.01); G06T 7/60 (2013.01); G06T 7/70 (2017.01); G06T 7/97 (2017.01); G06V 10/28 (2022.01); H01L 21/67259 (2013.01); H01L 21/68 (2013.01); H05K 3/4638 (2013.01); *G06T 2207/30148* (2013.01); *H05K 2203/166* (2013.01)

(58) Field of Classification Search
  CPC ............ G03F 7/70616; G03F 7/70625; G03F 7/70633; G03F 7/7065; G03F 7/70666; G03F 9/7003; G03F 9/7007; G03F 9/7023; G03F 9/7073; G03F 9/7084; G03F 9/7088; G03F 9/7092; H05K 3/0008; H05K 3/46; H05K 3/4638; H05K 13/0015; H05K 2203/166
  USPC ....... 382/100, 141, 144, 145, 149–152, 169, 382/171, 172, 199, 263, 266, 274, 282, 382/286–288, 291; 348/86, 87, 94, 95, 348/125, 126; 438/16, 401; 702/35, 36, 702/94, 95, 127, 150, 152, 155, 166, 167, 702/169, 189–191, 193
  See application file for complete search history.

(56) References Cited

U.S. PATENT DOCUMENTS

| | | |
|---|---|---|
| 9,754,895 B1 * | 9/2017 | Chao .................... G06T 7/11 |
| 10,241,434 B2 * | 3/2019 | Araki ................ G03G 15/0131 |
| 10,720,307 B2 | 7/2020 | Takagi et al. |
| 10,783,625 B2 | 9/2020 | Harada et al. |
| 10,816,332 B2 | 10/2020 | Ohta et al. |
| 10,816,333 B2 | 10/2020 | Kawada |
| 2003/0168596 A1 | 9/2003 | Sasajima et al. |
| 2016/0379798 A1 | 12/2016 | Shishido et al. |

FOREIGN PATENT DOCUMENTS

| | | |
|---|---|---|
| JP | 2015-106530 A | 6/2015 |
| JP | 6051301 B2 | 12/2016 |
| JP | WO 2017/179138 A1 | 10/2017 |
| JP | 2018-45871 A | 3/2018 |
| JP | 6362827 B2 | 7/2018 |
| JP | 2019-60806 A | 4/2019 |
| WO | WO 2018/020627 A1 | 2/2018 |

* cited by examiner

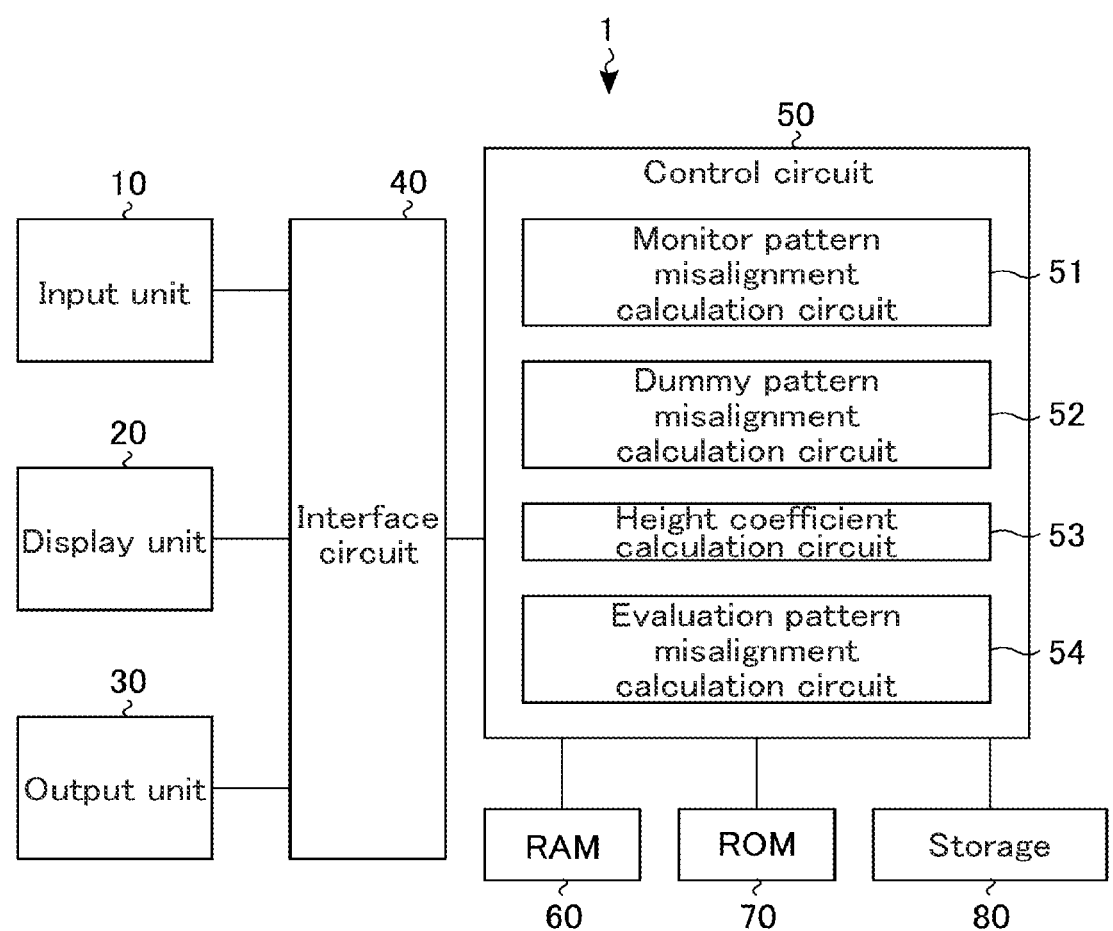
F I G. 1

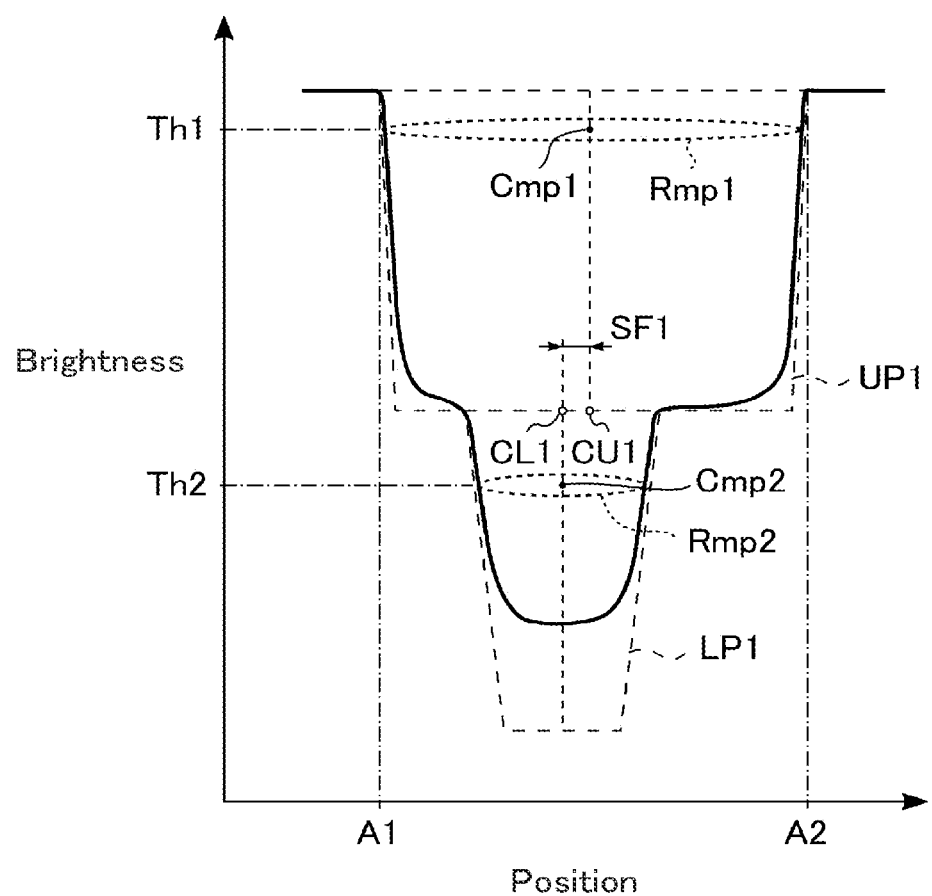
F I G. 6

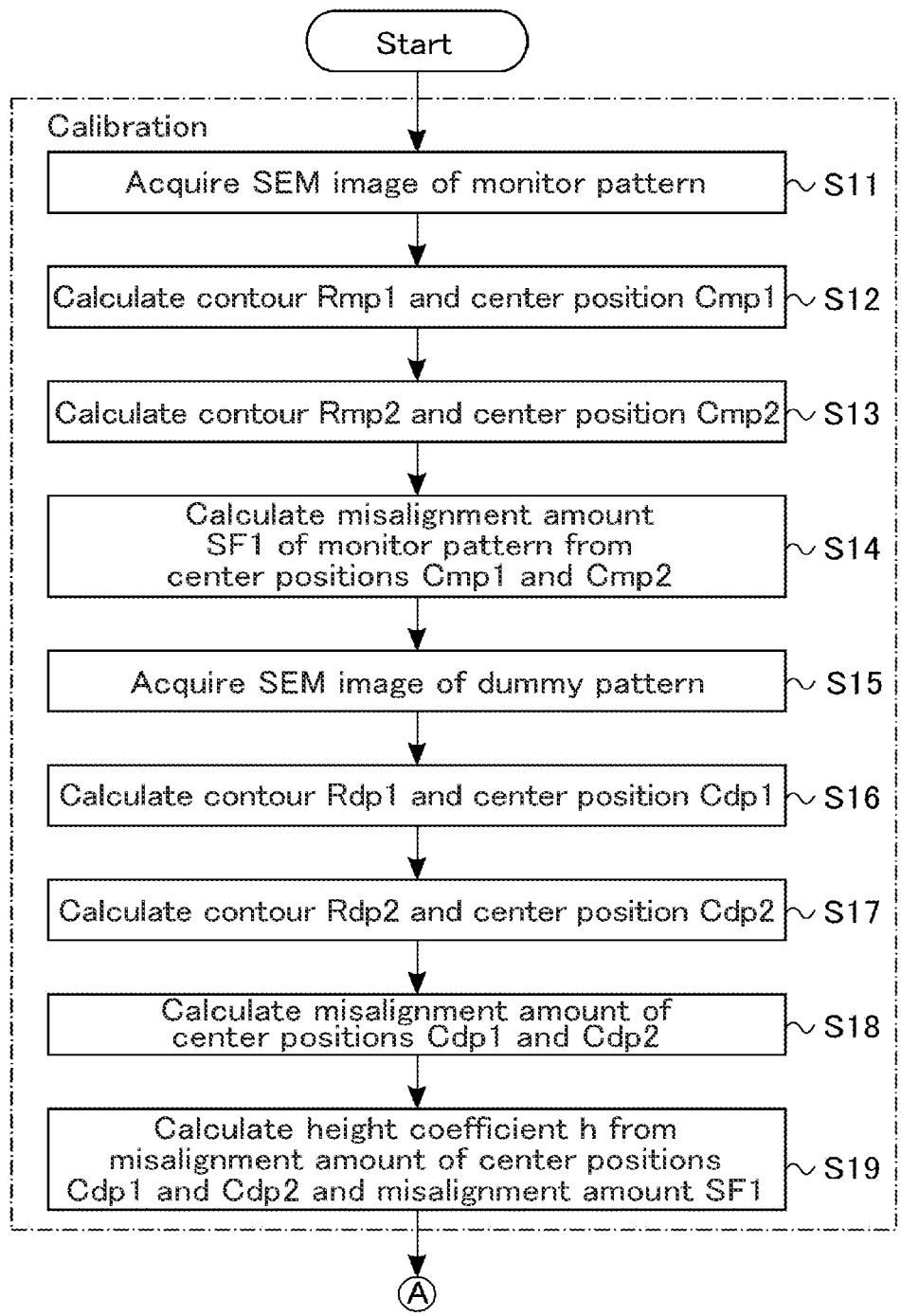
F I G. 9

MISALIGNMENT MEASURING APPARATUS AND MISALIGNMENT MEASURING METHOD

CROSS-REFERENCE TO RELATED APPLICATIONS

This application is based upon and claims the benefit of priority from Japanese Patent Application. No. 2020-118338, filed Jul. 9, 2020, the entire contents of which are incorporated herein by reference.

FIELD

Embodiments described herein relate generally to a misalignment measuring apparatus and a misalignment measuring method.

BACKGROUND

In a manufacturing process of a semiconductor device, for example, when holes or trenches having a high aspect ratio are formed, a plurality of holes or trenches (hereinafter, referred to as "patterns") may be stacked in a direction perpendicular to a semiconductor substrate to form a desired shape. If the patterns that have been stacked (hereinafter, referred to as the "stacked patterns") are misaligned, poor embedding of the patterns may occur, and reliability of the semiconductor device may be lowered. When the misalignment (superposition accuracy) of the patterns is measured, the misalignment may be measured using a scanning electron microscope (SEM).

BRIEF DESCRIPTION OF THE DRAWINGS

FIG. 1 is a conceptual diagram showing a configuration of a misalignment measuring apparatus according to an embodiment;

FIG. 6 is a diagram showing a brightness profile of the monitor pattern taken along the line A1-A2 of FIG. 4;

FIG. 9 is a flowchart showing an overall flow of a misalignment measuring method according to the embodiment.

DETAILED DESCRIPTION

Figure 2:
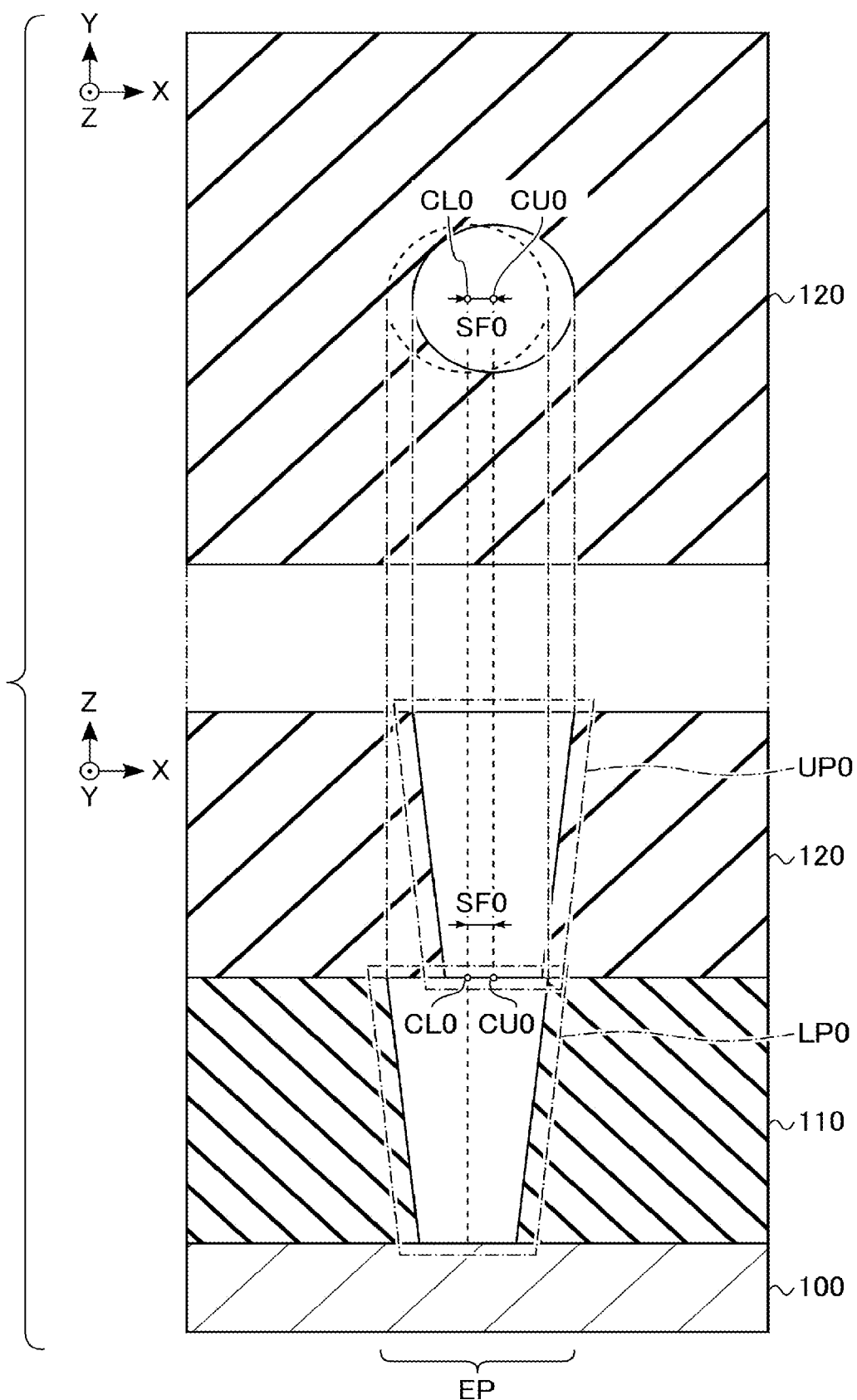
FIG. 2 is a diagram showing a plane and a cross-section of an evaluation pattern.

In general, according to one embodiment, a misalignment measuring apparatus that measures a first misalignment amount between a first pattern and a second pattern formed on the first pattern, the misalignment measuring apparatus includes: an input circuit configured to receive an image; a storage medium configured to store the image; a first circuit configured to, in a first calibration pattern including a third pattern corresponding to the first pattern and a fourth pattern formed on the third pattern, calculate a second misalignment amount between the third pattern and the fourth pattern; a second circuit configured to, using a first image of a second calibration pattern including a fifth pattern corresponding to the first pattern and a sixth pattern formed on the fifth pattern and corresponding to the second pattern, calculate a first center position of a first contour based on a first threshold corresponding to the fifth pattern and a second center position of a second contour based on a second threshold corresponding to the fifth pattern, and calculate a third misalignment amount between the first center position and the second center position; a third circuit configured to calculate a coefficient indicating a relation between the second misalignment amount and the third misalignment amount; and a fourth circuit configured to, using a second image corresponding to the first and second patterns, calculate a third center position of a third contour based on a third threshold corresponding to the first pattern and a fourth center position of a fourth contour based on a fourth threshold corresponding to the first pattern, calculate a fourth misalignment amount between the third center position and the fourth center position, and calculate the first misalignment amount between the first pattern and the second pattern based on the fourth misalignment amount and the coefficient.

Hereinafter, embodiments will be described with reference to the drawings. In the following description, components having substantially the same function and configuration will be designated by the same reference numerals, and duplicate explanations will be given only when necessary. In addition, each embodiment shown below exemplifies apparatuses and methods for embodying the technical idea of the embodiment, and the technical idea of the embodiment does not specify the materials, shapes, structures, arrangements, etc. of the components to the following. The technical idea of the embodiment can be modified in various ways within a scope of claims.

In a manufacturing process of a semiconductor device, internal stress is generated by expansion or contraction of a material due to heat treatment or the like. Due to an influence of the internal stress, when patterns are stacked at the same coordinates, misalignment may occur for each layer. Since a misalignment amount is affected by a chip layout, a device structure, and the like, the misalignment amount may be different within a chip surface. A misalignment measuring apparatus according to the present embodiment is applied when the misalignment of two patterns stacked at arbitrary positions in a chip is measured.

In the following embodiment, a case of measuring misalignment of two hole patterns stacked in a direction perpendicular to a semiconductor substrate in the manufacturing process of the semiconductor device will be described. Note that the stacked pattern is not limited to a hole shape. For example, two line (groove shape) patterns may be stacked, or a hole pattern and a line pattern may be stacked.

In the present embodiment, a case where an SEM is an external device will be described. However, the misalignment measuring apparatus according to the present embodiment may be embedded in the SEM.

1. Configuration

First, a configuration of the misalignment measuring apparatus will be described using FIG. 1. FIG. 1 is a conceptual diagram showing an example of the configuration of the misalignment measuring apparatus.

As shown in FIG. 1, a misalignment measuring apparatus 1 includes an input unit (circuit) 10, a display unit (device) 20, an output unit (circuit) 30, an interface circuit 40, a control circuit 50, a random access memory (RAM) 60, a read only memory (ROM) 70, and a storage 80.

The input unit 10 is used for inputting data (SEM image data, chip layout data, and the like), parameters, and the like. For example, the input unit 10 includes a keyboard, a mouse, and the like that allow a user to input parameters and the like. Further, for example, the input unit 10 executes interface processing when data is received from an external device (an SEM, various storage media, or an external database). For example, when data is input from an external device by wireless communication, the misalignment measuring apparatus 1 includes a communication unit including an antenna, and the input unit 10 is coupled to the communication unit. Further, for example, when the misalignment measuring apparatus 1 includes a drive such as a compact disk (CD) or a digital versatile disk (DVD), the input unit 10 is coupled to the drive.

The display unit 20 is used to transmit a processing result of the control circuit 50 to the user. For example, the display unit 20 includes a display (a liquid crystal display (LCD), an electroluminescence (EL) display, or a cathode ray tube).

The output unit 30 outputs the processing result of the control circuit 50. For example, the output unit 30 executes interface processing when data is output to an external device (an SEM, an external database, a printer, or various storage media). For example, when data is output to an external device by wireless communication, the output unit 30 is coupled to the communication unit. Further, for example, when the misalignment measuring apparatus 1 includes the drive, the output unit 30 is coupled to the drive.

The interface circuit 40 executes interface processing between the input unit 10, the display unit 20, and the output unit 30 and the control circuit 50. For example, the interface circuit 40 may include a graphical user interface (GUI) and the like coupled to the display unit 20.

The control circuit 50 includes, for example, a central processing unit (CPU), and controls the entire misalignment measuring apparatus 1. Note that each function of the control circuit 50 may be realized by a dedicated circuit, or each function of the control circuit 50 may be realized by executing firmware. Hereinafter, a case where the control circuit 50 executes arithmetic processing based on a program (firmware) stored in the ROM 70 and measures the misalignment will be described.

The control circuit 50 includes a monitor pattern misalignment calculation circuit 51, a dummy pattern misalignment calculation circuit 52, a height coefficient calculation circuit 53, and an evaluation pattern misalignment calculation circuit 54.

By using image data (electron beam image data) of the SEM having observed a surface of a monitor pattern, the monitor pattern misalignment calculation circuit 51 calculates a contour of a pattern connecting pixels of a brightness corresponding to a preset threshold and the coordinates of a center position of the contour (hereinafter, also referred to as "center position data"). In the SEM image data, the brightness (gradation value) of each pixel represents the electron detection signal strength. For example, the brightness (gradation value) may be set as the threshold, or a ratio to a difference in the brightness may be set as the threshold because conditions such as contrast are different for each image data. Note that the threshold can be set arbitrarily. The monitor pattern misalignment calculation circuit 51 can form the contour by connecting pixels corresponding to the threshold. The monitor pattern in the present embodiment includes a lower layer pattern and an upper layer pattern. The monitor pattern is a calibration pattern that is used to calculate the misalignment amount between the lower layer pattern and the upper layer pattern and is not applied to a circuit configuration of the semiconductor device. The details of the monitor pattern will be described later. For example, the monitor pattern may be provided in a dummy region (region where no element is formed) provided at the boundary of the layout in the chip, or may be provided in a region where no element is formed like an outer peripheral region of the chip. The outer peripheral region of the chip is, for example, a region provided with a scribe line, an alignment pattern for photolithography used in a manufacturing process of the semiconductor device, or a characteristic check pattern.

More specifically, in the present embodiment, when the monitor pattern is measured, a threshold corresponding to the lower layer pattern and a threshold corresponding to the upper layer pattern are set in advance. The monitor pattern misalignment calculation circuit 51 forms the contour of the lower layer pattern by connecting pixels of the brightness corresponding to the threshold of the lower layer pattern. Similarly, the monitor pattern misalignment calculation circuit 51 forms the contour of the upper layer pattern by connecting pixels of the brightness corresponding to the threshold of the upper layer pattern. Then, the monitor pattern misalignment calculation circuit 51 calculates center position data of the contour of the lower layer pattern and center position data of the contour of the upper layer pattern. Note that the center position may be the center of gravity of the contour or the center of a rectangle circumscribed (or inscribed) to the contour.

Further, by using the center position data of the contour of the lower layer pattern of the monitor pattern and the center position data of the contour of the upper layer pattern, the monitor pattern misalignment calculation circuit 51 calculates a misalignment amount between the two center positions.

By using image data of the SEM having observed a surface of the dummy pattern, the dummy pattern misalignment calculation circuit 52 calculates the contour of the dummy pattern connecting pixels of the brightness corresponding to the preset threshold and the center position data of the contour. The dummy pattern in the present embodiment includes a lower layer pattern and an upper layer pattern. The dummy pattern is a calibration pattern that is provided in the vicinity of the monitor pattern and has substantially the same shape as an evaluation pattern to be measured. The dummy pattern may be a pattern applied to the circuit configuration of the semiconductor device, or may be a pattern not applied to the circuit configuration of the semiconductor device. The details of the dummy pattern will be described later.

More specifically, in the present embodiment, when the dummy pattern is measured, two thresholds corresponding to the lower layer pattern are set in advance. For example, the dummy pattern misalignment calculation circuit 52 calculates the contour connecting pixels of the brightness corresponding to each threshold and the center position data of the contour, from the two thresholds of the lower layer pattern. Note that the setting of the threshold in the dummy pattern is arbitrary. For example, a threshold corresponding to the upper layer pattern may be further set, or three or more thresholds corresponding to the lower layer pattern may be set.

Further, the dummy pattern misalignment calculation circuit 52 uses the two center position data of the dummy pattern to calculate a misalignment amount between the two center positions.

The height coefficient calculation circuit 53 calculates a coefficient (hereinafter, referred to as the "height coefficient") representing a relation between the misalignment amount of the monitor pattern and the misalignment amount of the two center position data of the dummy pattern.

By using image data of the SEM having observed a surface of the evaluation pattern, the evaluation pattern misalignment calculation circuit 54 calculates the contour of the evaluation pattern corresponding to the preset threshold and the center position data of the contour. The evaluation pattern in the present embodiment includes a lower layer pattern and an upper layer pattern. The evaluation pattern is a pattern applied to the circuit configuration of the semiconductor device, and can be arbitrarily extracted in the circuit region of the chip. The details of the evaluation pattern will be described later.

More specifically, for example, the evaluation pattern misalignment calculation circuit 54 calculates two contours and two center position data from two thresholds having the same settings as the dummy pattern, similarly to the dummy pattern.

Further, the evaluation pattern misalignment calculation circuit 54 uses the two center position data of the evaluation pattern to calculate a misalignment amount between the two center positions.

Furthermore, the evaluation pattern misalignment calculation circuit 54 calculates a misalignment amount in the evaluation pattern by using the height coefficient and the misalignment amount between the two center positions of the evaluation pattern.

The RAM 60 is used as a work area of the control circuit 50. Further, the RAM 60 temporarily holds misalignment measurement results and parameters.

The ROM 70 is a non-transitory computer readable storage medium in which a program (firmware) for measuring the misalignment and the like are stored.

The storage 80 is, for example, a hard disk drive (HDD), a solid state drive (SSD), or the like. For example, SEM image data, evaluation pattern layout data, various parameters, and measurement results are stored in the storage 80.

2. Specific Examples of Patterns

Next, specific examples of the evaluation pattern, the monitor pattern, and the dummy pattern will be described. In the following, to simplify the explanation, a case where the misalignment of the stacked patterns occurs in an X direction parallel to the semiconductor substrate and does not occur in a Y direction parallel to the semiconductor substrate and intersecting the X direction will be described.

2.1. Example of Evaluation Pattern

First, an example of the evaluation pattern will be described using FIG. 2. FIG. 2 shows a top surface and a cross-section of the evaluation pattern. In the example of FIG. 2, to simplify the explanation, a case where each of the upper layer pattern and the lower layer pattern is formed in an insulating layer of a single layer is shown, but a structure of the layer in which the pattern is formed is arbitrary. Each layer may be a stacked body or may contain a conductive material.

As shown in FIG. 2, for example, insulating layers 110 and 120 are stacked on the semiconductor substrate 100. An evaluation pattern EP includes a lower layer pattern LP0 and an upper layer pattern UP0.

The lower layer pattern LP0 has, for example, a substantially cylindrical shape and penetrates the insulating layer 110. For example, a bottom surface of the lower layer pattern LP0 is in contact with the semiconductor substrate 100. The upper layer pattern UP0 is provided on the lower layer pattern LP0. The upper layer pattern UP0 has, for example, a substantially cylindrical shape and penetrates the insulating layer 120. A bottom surface of the upper layer pattern UP0 reaches the insulating layer 110 (the top surface of the lower layer pattern LP0). For example, each of the lower layer pattern LP0 and the upper layer pattern UP0 has a tapered shape in which a diameter in an XY plane decreases from an opening to a bottom portion. Therefore, the diameter of the bottom portion of the upper layer pattern UP0 is smaller than the diameter of the opening of the lower layer pattern LP0. Therefore, when the surface is observed by the SEM after the upper layer pattern UP0 is formed, the SEM cannot observe the entire lower layer pattern LP0 through the upper layer pattern UP0.

A center position in the lower layer pattern LP0 is expressed as CL0. A center position in the upper layer pattern UP0 is expressed as CU0. Further, a misalignment amount between the center positions CL0 and CU0 is expressed as SF0. In the example of FIG. 2, the center position CU0 of the upper layer pattern UP0 is shifted in the X direction by a misalignment amount SF0 with respect to the center position CL0 of the lower layer pattern LP0.

The example of FIG. 2 shows a case where the shape of the lower layer pattern LP0 and the shape of the upper layer pattern UP0 are substantially the same, but the shapes of the lower layer pattern LP0 and the upper layer pattern UP0 can be arbitrarily designed. For example, the opening diameters of the patterns (diameters of the openings) and the heights of the patterns (thickness of the insulating layers 110 and 120) may be different from each other, respectively.

2.2. Examples of Monitor Pattern and Dummy Pattern

Figure 3:
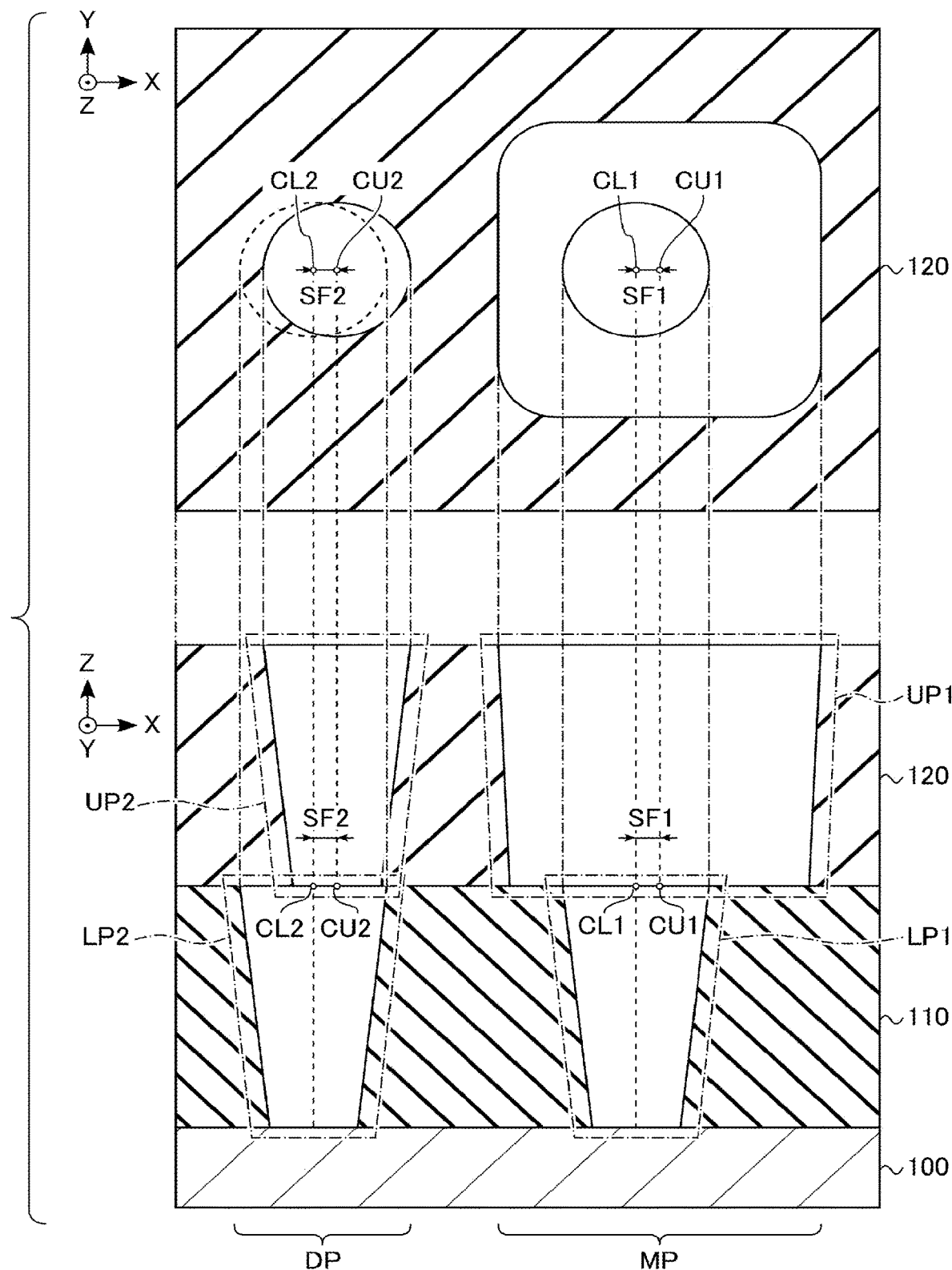
FIG. 3 is a diagram showing planes and cross-sections of a monitor pattern and a dummy pattern.

Next, examples of a monitor pattern MP and a dummy pattern DP will be described using FIG. 3. FIG. 3 shows top surfaces and cross-sections of the monitor pattern MP and the dummy pattern DP. In the example of FIG. 3, to simplify the explanation, a case where each of the upper layer pattern and the lower layer pattern is formed in an insulating layer of a single layer is shown, but a structure of the layer in which the pattern is formed is arbitrary. Each layer may be a stacked body or may contain a conductive material.

As shown in FIG. 3, the monitor pattern MP includes a lower layer pattern LP1 and an upper layer pattern UP1.

The lower layer pattern LP1 has, for example, a substantially cylindrical shape and penetrates the insulating layer 110. For example, a bottom surface of the lower layer pattern LP1 is in contact with the semiconductor substrate 100. The upper layer pattern UP1 is provided on the lower layer pattern LP1. The upper layer pattern UP1 has, for example, a substantially square cylinder shape and penetrates the insulating layer 120.

For example, the lower layer pattern LP1 has substantially the same shape as the lower layer pattern LP0 of the evaluation pattern EP. That is, the lower layer pattern LP1 is formed by using a mask pattern having the same size as the lower layer pattern LP0. Note that the lower layer pattern LP1 may be different from the lower layer pattern LP0 of the evaluation pattern EP. The lower layer pattern LP1 may have a shape whose contour can be extracted through the upper layer pattern UP1.

On the other hand, the upper layer pattern UP1 has a different shape from the upper layer pattern UP0 of the evaluation pattern EP. An opening area of the upper layer pattern UP1 is larger than an opening area of the lower layer pattern LP1. More specifically, the upper layer pattern UP1 has a sufficiently large opening area (bottom portion area) so that the entire opening (side surface) of the lower layer pattern LP1 can be observed by the SEM even if the upper layer pattern UP1 is positionally shifted with respect to the lower layer pattern LP1. Therefore, the shape of the upper layer pattern UP1 is different from the shape of the upper layer pattern UP0 of the evaluation pattern EP. Here, a center position in the lower layer pattern LP1 is expressed as CL1, and a center position in the upper layer pattern UP1 is expressed as CU1. Further, a misalignment amount between the center positions CL1 and CU1 is expressed as SF1. In the example of FIG. 3, the center position CU1 of the upper layer pattern UP1 is shifted in the X direction by the misalignment amount SF1 with respect to the center position CL1 of the lower layer pattern LP1.

Next, the dummy pattern will be described.

The dummy pattern DP includes a lower layer pattern LP2 and an upper layer pattern UP2. The lower layer pattern LP2 has, for example, a substantially cylindrical shape and penetrates the insulating layer 110. For example, a bottom surface of the lower layer pattern LP2 is in contact with the semiconductor substrate 100. The upper layer pattern UP2 is provided on the lower layer pattern LP2. The upper layer pattern UP2 has, for example, a substantially cylindrical shape and penetrates the insulating layer 120. The bottom surface of the upper layer pattern UP2 reaches the insulating layer 110 (the top surface of the lower layer pattern LP2).

The lower layer pattern LP2 has substantially the same shape as the lower layer pattern LP0 of the evaluation pattern EP. Similarly, the upper layer pattern UP2 has substantially the same shape as the upper layer pattern UP0 of the evaluation pattern EP. Here, a center position in the lower layer pattern LP2 is expressed as CL2, and a center position in the upper layer pattern UP2 is expressed as CU2. Further, a misalignment amount between the center positions CL2 and CU2 is expressed as SF2. In the example of FIG. 3, the center position CU2 of the upper layer pattern UP2 is shifted in the X direction by the misalignment amount SF2 with respect to the center position CL2 of the lower layer pattern LP2.

The dummy pattern DP is disposed adjacent to, for example, the monitor pattern MP so that the misalignment amount SF1 in the monitor pattern MP and the misalignment amount SF2 in the dummy pattern DP are substantially the same. In this case, the monitor pattern MP and the dummy pattern DP are similarly affected by the semiconductor substrate 100 due to internal stress and the like. Therefore, the misalignment amounts SF1 and SF2 are substantially the same.

The evaluation pattern EP and the dummy pattern DP have substantially the same shape, but the misalignment amounts SF0 and SF1 may be different depending on the arrangement of the patterns.

3. Example of Image Data of SEM

Next, an example of image data of the SEM will be described.

3.1. Examples of Contours and Center Positions of Patterns

Figure 4:
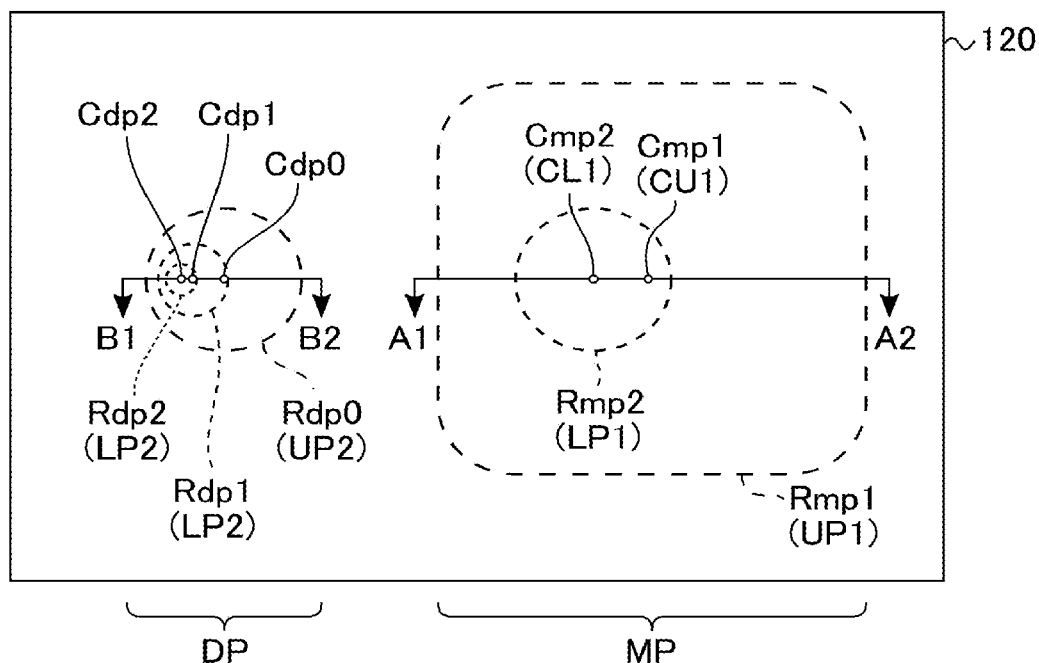
FIG. 4 is a conceptual diagram showing a relation between contours and center positions of the monitor pattern and the dummy pattern.
Figure 5:
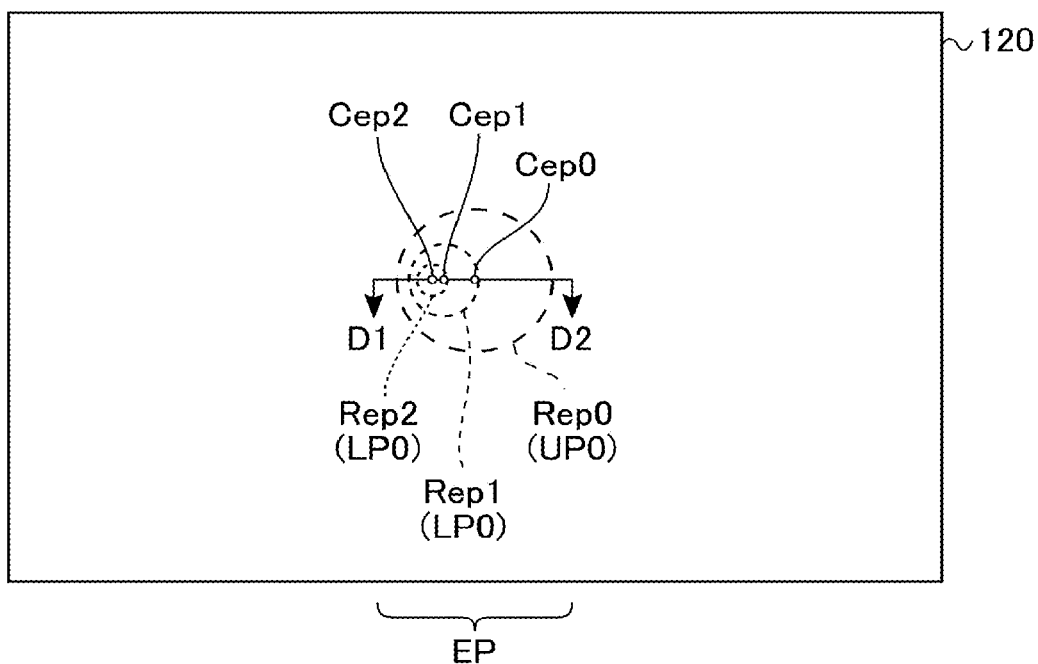
FIG. 5 is a conceptual diagram showing a relation between a contour and a center position of the evaluation pattern.

First, examples of contours and center positions calculated from a surface observation image (image data) of the SEM will be described using FIGS. 4 and 5. FIG. 4 is a conceptual diagram showing examples of the contours of the monitor pattern MP and the dummy pattern DP calculated from the image data of the SEM. FIG. 5 is a conceptual diagram showing an example of the contour of the evaluation pattern EP calculated from the image data of the SEM. In the examples of FIGS. 4 and 5, the SEM image data (brightness contrast) is omitted.

As shown in FIG. 4, contours calculated based on thresholds are shown by broken lines. For example, in the present embodiment, a threshold Th1 corresponding to the upper layer pattern UP1 and a threshold Th2 corresponding to the lower layer pattern LP1 are set for the monitor pattern MP. Then, the contours of the patterns connecting pixels of the brightness corresponding to the thresholds Th1 and Th2 and center position data thereof are calculated. Hereinafter, the contour calculated based on the threshold Th1 in the monitor pattern is expressed as Rmp1. The center position calculated based on the contour Rmp1 is expressed as Cmp1. Further, the contour calculated based on the threshold Th2 in the monitor pattern is expressed as Rmp2. The center position calculated based on the contour Rmp2 is expressed as Cmp2.

In the case of the monitor pattern MP, an entire image of an opening of each of the upper layer pattern UP1 and the lower layer pattern LP1 can be observed in the surface observation image of the SEM. Therefore, the contours Rmp1 and Rmp2 reflect the shape of the monitor pattern MP. The center position Cmp1 calculated from the contour Rmp1 of the upper layer pattern UP1 is substantially the same as the center position CU1 of the upper layer pattern UP1 described in FIG. 3. Further, the center position Cmp2 calculated from the contour Rmp2 of the lower layer pattern. LP1 is substantially the same as the center position CL1 of the lower layer pattern LP1 described in FIG. 3. Therefore, the misalignment amount SF1 can be calculated from the center positions Cmp1 and Cmp2.

In the case of the dummy pattern DP, an entire image of an opening of the lower layer pattern LP2 cannot be observed. In this case, the contour mostly does not show the shape of the lower layer pattern. Therefore, when the contour of the lower layer pattern LP2 and the center position thereof are calculated, the center position is different from the center position CL2 described in FIG. 3. However, the center position is shifted from the center position of the upper layer pattern UP2 in accordance with the threshold (corresponding to a depth position of the lower layer pattern LP2) and the misalignment amount SF2. For example, in the present embodiment, two thresholds Th3 and Th4 corresponding to the lower layer pattern LP2 are set for the dummy pattern DP. For example, the thresholds Th3 and Th4 have a relation of Th3>Th4. That is, the brightness corresponding to the threshold Th3 is higher than the brightness corresponding to the threshold Th4. In other words, at a height position of the lower layer pattern LP2, the threshold Th3 is located above the threshold Th4 (the side closer to the upper layer pattern UP2). Note that the threshold Th2 set in the monitor pattern MP may be the same as the threshold Th3 or Th4, or may be different. Hereinafter, the contours calculated based on the thresholds Th3 and Th4 are expressed as Rdp1 and Rdp2, respectively. Further, the center positions calculated based on the contours Rdp1 and Rdp2 are expressed as Cdp1 and Cdp2, respectively. In the example of FIG. 4, to show the position of the upper layer pattern UP2, a contour Rdp0 and a center position Cdp0 calculated based on the threshold Th1 set for measuring the monitor pattern MP are shown. However, in the misalignment measurement of the present embodiment, the center position Cdp0 may not be calculated.

For example, the center position Cdp0 is almost the same as the center position CU2 of the upper layer pattern UP2 described in FIG. 3. For example, when the thresholds are in a relation of Th3>Th4, that is, when the contour Rdp1 corresponds to the position of the upper side (side of the upper layer pattern UP2) of the lower layer pattern. LP2 than the contour Rdp2, a distance between the center positions Cdp0 and Cdp1 is shorter than a distance between the center positions Cdp0 and Cdp2. Note that the distance between the center positions Cdp0 and Cdp1 and the distance between the center positions Cdp0 and Cdp2 are different from the misalignment amount SF2. A relation between the misalignment amount SF2 and the center positions Cdp1 and Cdp2 will be described later.

As shown in FIG. 5, like the dummy pattern DP, in the case of the evaluation pattern EP, the entire image of the opening of the lower layer pattern LP0 cannot be observed. In the present embodiment, when the contour and the center position of the evaluation pattern EP are calculated, the same thresholds Th3 and Th4 as the dummy pattern DP are used. Hereinafter, the contours calculated based on the thresholds Th3 and Th4 in the evaluation pattern EP are expressed as Rep1 and Rep2, respectively. Further, the center positions calculated based on the contours Rep1 and Rep2 are expressed as Cep1 and Cep2, respectively. In the example of FIG. 5, to show the position of the upper layer pattern UP0, the contour Rep0 and the center position Cep0 calculated based on the threshold Th1 are shown. However, in the misalignment measurement of the present embodiment, the center position Cep0 may not be calculated.

For example, the center position Cep0 is almost the same as the center position CU0 of the upper layer pattern UP0 described in FIG. 2. For example, when the thresholds are in a relation of Th3>Th4, that is, when the contour Rep1 corresponds to the position of the upper side (side of the upper layer pattern UP0) of the lower layer pattern LP0 than the contour Rep2, a distance between the center positions Cep0 and Cep1 is shorter than a distance between the center positions Cep0 and Cep2. Note that the distance between the center positions Cep0 and Cep1 and the distance between the center positions Cep0 and Cep2 are different from the misalignment amount SF0.

3.2. Examples of Brightness Profiles of Patterns

Figure 7:
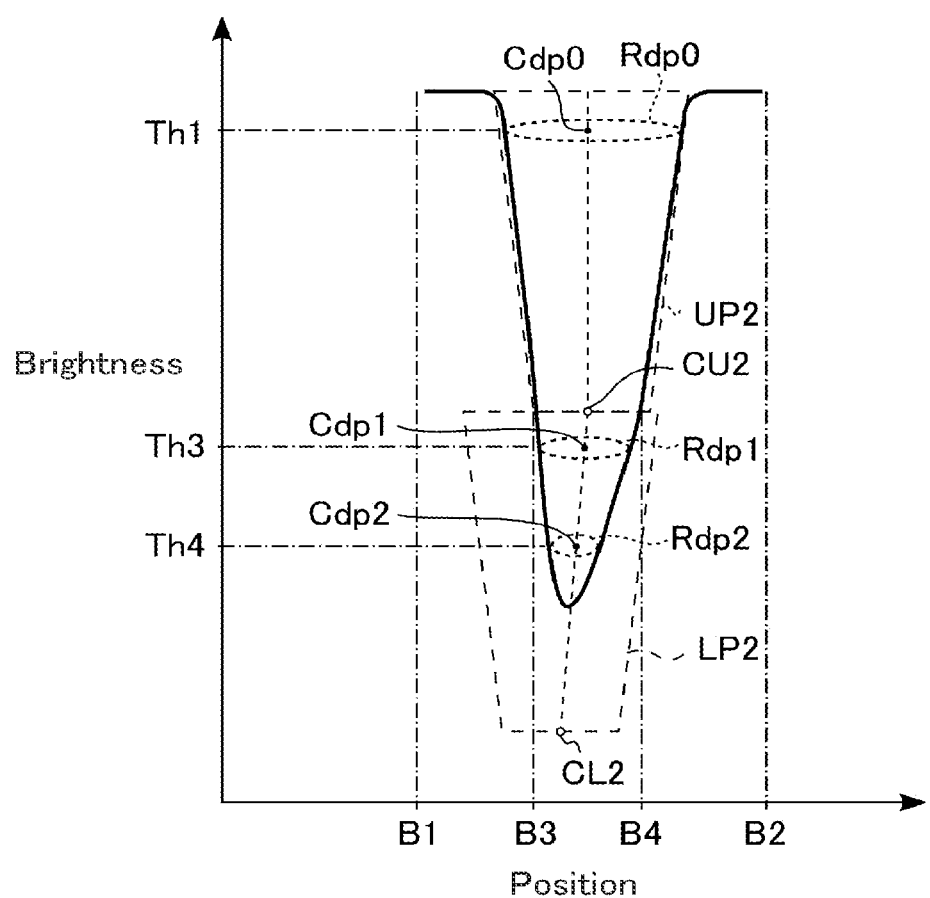
FIG. 7 is a diagram showing a brightness profile of the dummy pattern taken along the line B1-B2 of FIG. 4.
Figure 8:
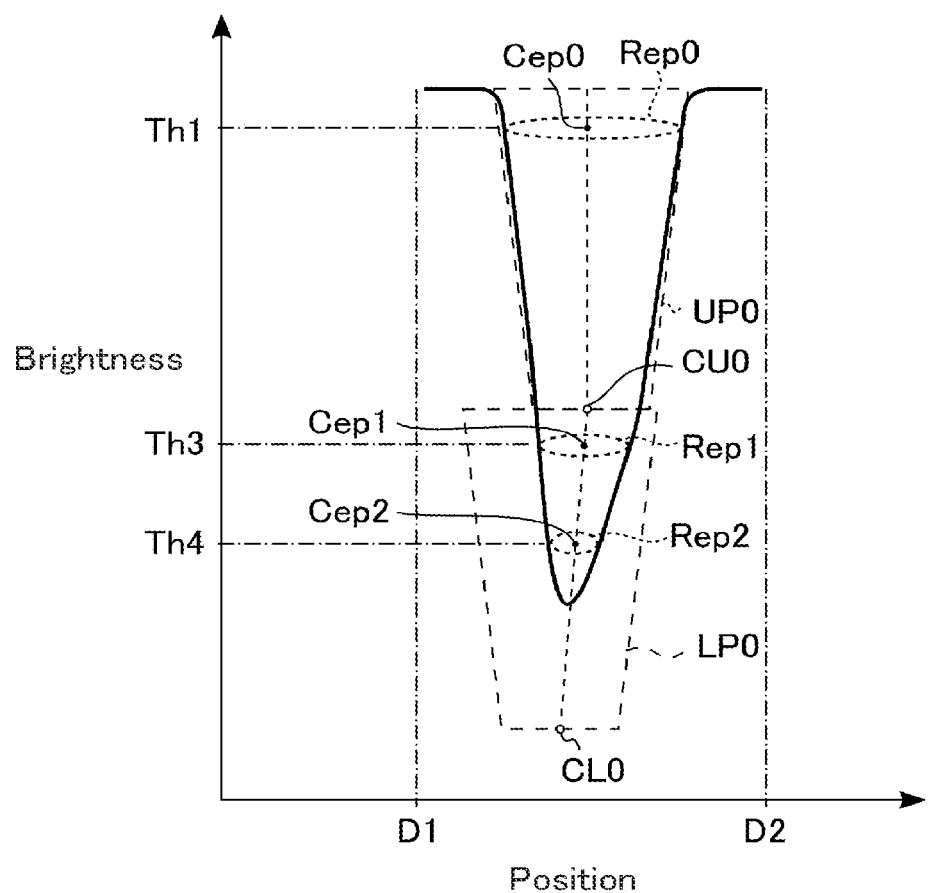
FIG. 8 is a diagram showing a brightness profile of the evaluation pattern taken along the line D1-D2 of FIG. 5.

Next, examples of the brightness profiles of the patterns calculated from the SEM image data will be described using FIGS. 6 to 8. FIG. 6 is a conceptual diagram showing an example of a brightness profile of the monitor pattern MP taken along the line A1-A2 of FIG. 4. FIG. 7 is a conceptual diagram showing an example of a brightness profile of the dummy pattern DP taken along the line B1-B2 of FIG. 4. FIG. 8 is a conceptual diagram showing an example of a brightness profile of the evaluation pattern EP taken along the line D1-D2 of FIG. 5.

As shown in FIG. 6, a solid line shows the brightness in each pixel. The brightness is highest on a surface of a sample (a surface of the insulating layer 120), and the brightness is lowest inside the lower layer pattern LP1. The brightness profile tends to be broader than the shape of the monitor pattern MP, due to an influence of an irradiation width of an electron beam or a depth of focus. The example of FIG. 6 shows a case where the irradiated electron beam of the SEM does not reach the bottom portion of the lower layer pattern LP1, that is, the bottom portion cannot be observed, but the present disclosure is not limited thereto. For example, in a case where an aspect ratio of the monitor pattern MP is relatively low, the bottom portion of the lower layer pattern LP1 may also be observed. The thresholds Th1 and Th2 are set so that the contours Rmp1 and Rmp2 corresponding to the upper layer pattern UP1 and the lower layer pattern LP1 can be calculated for the brightness profile shown in FIG. 6.

As shown in FIG. 7, in the case of the dummy pattern DP, information about the shape (side surface) of the lower layer pattern LP2 is not often obtained from the brightness profile (the side surface is not often observed in a surface observation image). However, information corresponding to the misalignment is included in a brightness profile between B3 and B4 that corresponds to the bottom portion of the upper layer pattern UP2. More specifically, due to an influence of interference between the electron beam having reached the inside of the lower layer pattern LP2 and the side surface of the lower layer pattern LP2, or scattering of the electron beam in the lower layer pattern LP2, the detected electrons (brightness profile) are deflected toward the center position CL2 of the lower layer pattern LP2. Therefore, the center position Cdp1 corresponding to the threshold Th3 and the center position Cdp2 corresponding to the threshold Th4 are located on a straight line connecting the center position CL2 of the lower layer pattern LP2 and the center position CU2 of the upper layer pattern UP2. For this reason, a difference between the center positions CL2 and CU2 (the misalignment amount SF2) and a difference between the center positions Cdp1 and Cdp2 are in an approximately proportional relation. By obtaining a coefficient (height coefficient) representing the above relation, the misalignment amount SF2 can be calculated from the center positions Cdp1 and Cdp2 and the height coefficient. Since the misalignment amounts are in a relation of SF1≈SF2, a height coefficient h can be calculated from the misalignment amount SF1 of the monitor pattern MP and the center positions Cdp1 and Cdp2 of the dummy pattern DP.

As shown in FIG. 8, the brightness profile of the evaluation pattern EP shows the same tendency as the brightness profile of the dummy pattern DP. Therefore, the center position Cep1 corresponding to the threshold Th3 and the center position Cep2 corresponding to the threshold Th4 are located on the straight line connecting the center position CL0 of the lower layer pattern LP0 and the center position CLT0 of the upper layer pattern UP0. By using the center positions Cep1 and Cdp2 and the height coefficient h, the misalignment amount SF0 in the evaluation pattern EP can be calculated.

4. Misalignment Measurement Operation

Figure 10:
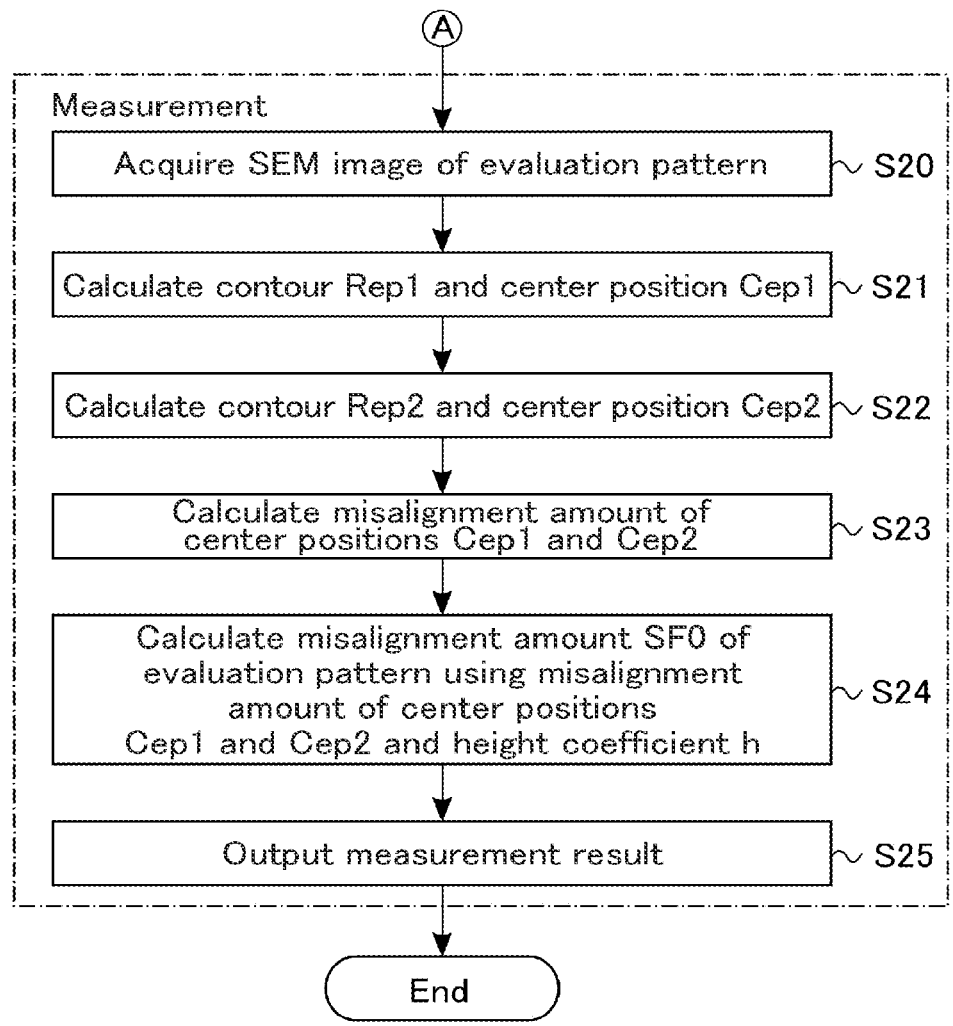
FIG. 10 is a flowchart showing an overall flow of the misalignment measuring method according to the embodiment.

Next, an example of a misalignment measurement operation will be described using FIGS. 9 and 10. FIGS. 9 and 10 are flowcharts showing an overall flow of the misalignment measurement operation.

The misalignment measurement operation roughly includes a calibration operation and a measurement operation.

The calibration operation is an operation of obtaining the height coefficient h by using the monitor pattern MP and the dummy pattern DP. Note that the number of each of the monitor pattern MP and the dummy pattern DP used for calibration may be one or more. Further, a plurality of dummy patterns DPs may be measured for one monitor pattern MP. Furthermore, the monitor pattern MP and the dummy pattern DP may be provided in a chip including the evaluation pattern EP, may be provided in different chips of the same wafer, or may be provided in different wafers having the same pattern. For example, as a method for calculating the height coefficient h, a least squares method using a plurality of data may be used.

The measurement operation is an operation of measuring the misalignment amount in the evaluation pattern EP by using the height coefficient h.

As shown in FIG. 9, the calibration operation is first performed.

The monitor pattern misalignment calculation circuit 51 acquires SEM image data (electron beam image) of the monitor pattern MP from the storage 80, for example (step S11).

Next, the monitor pattern misalignment calculation circuit 51 calculates the contour Rmp1 of the upper layer pattern UP1 and the center position Cmp1 thereof, based on the threshold Th1 (step S12).

Next, the monitor pattern misalignment calculation circuit 51 calculates the contour Rmp2 of the lower layer pattern LP1 and the center position Cmp2 thereof, based on the threshold Th2 (step S13). Note that steps S12 and S13 may be performed at the same time, or the order thereof may be changed.

Next, the monitor pattern misalignment calculation circuit 51 calculates the misalignment amount SF1 of the monitor pattern MP from the center positions Cmp1 and Cmp2 (step S14).

The dummy pattern misalignment calculation circuit 52 acquires SEM image data (electron beam image) of the dummy pattern DP from the storage 80, for example (step S15).

Next, the dummy pattern misalignment calculation circuit 52 calculates the contour Rdp1 of the lower layer pattern LP2 and the center position Cdp1 thereof, based on the threshold Th3 (step S16).

Next, the dummy pattern misalignment calculation circuit 52 calculates the contour Rdp2 of the lower layer pattern LP2 and the center position Cdp2 thereof, based on the threshold Th4 (step S17). Note that steps S16 and S17 may be performed at the same time, or the order thereof may be changed.

Next, the dummy pattern misalignment calculation circuit 52 calculates the misalignment amount between the center positions Cdp1 and Cdp2 (step S18). Note that the order of the operation of steps S11 to S14 executed by the monitor pattern misalignment calculation circuit 51 and the operation of steps S15 to S18 executed by the dummy pattern misalignment calculation circuit 52 may be changed.

Next, the height coefficient calculation circuit 53 calculates the height coefficient h from the misalignment amount between the center positions Cdp1 and Cdp2 and the misalignment amount SF1 (step S19). That is, the control circuit 50 obtains the height coefficient h as a result of the calibration.

As shown in FIG. 10, the measurement operation is then executed.

The evaluation pattern misalignment calculation circuit 54 acquires SEM image data of the evaluation pattern EP from the storage 80, for example (step S20).

Next, the evaluation pattern misalignment calculation circuit 54 calculates the contour Rep1 of the lower layer pattern LP0 and the center position Cep1 thereof, based on the threshold Th3 (step S21).

Next, the evaluation pattern misalignment calculation circuit 54 calculates the contour Rep2 of the lower layer pattern LP0 and the center position Cep2 thereof, based on the threshold Th4 (step S22). Note that steps S21 and S22 may be performed at the same time, or the order thereof may be changed.

Next, the evaluation pattern misalignment calculation circuit 54 calculates the misalignment amount between the center positions Cep1 and Cep2 (step S23).

Next, the evaluation pattern misalignment calculation circuit 54 calculates the misalignment amount SF0 of the evaluation pattern EP from the misalignment amount between the center positions Cep1 and Cep2 and the height coefficient h (step S24).

The control circuit 50 outputs a measurement result such as the image data of the evaluation pattern EP, the contours Rep1 and Rep2, the center positions Cep1 and Cep2, or the misalignment amount SF0 (step S25).

5. Effect of Present Embodiment

With the configuration according to the present embodiment, misalignment measurement accuracy of the patterns can be improved. The effects are described in detail.

In the misalignment measurement of the evaluation pattern having the stacked patterns, when the area of the opening of the lower layer pattern is larger than the area of the bottom portion of the upper layer pattern, the shape of the lower layer pattern cannot be confirmed in the surface observation image by the SEM, so that the misalignment cannot be measured. As a method for measuring the misalignment of the evaluation pattern in this case, there is a method for forming the monitor pattern at a measurement position (circuit region) and measuring a misalignment amount in the pattern. In this method, it may take several weeks to manufacture a reticle (mask) in which the monitor pattern for the misalignment measurement is provided in the circuit region. Further, a manufacturing cost of a dedicated reticle is incurred. Furthermore, since the wafer having the monitor pattern formed in the circuit region cannot be used in a product, the wafer is discarded after the misalignment measurement. Therefore, the above method requires the time and the cost.

On the other hand, in the configuration according to the present embodiment, the misalignment measuring apparatus includes the monitor pattern misalignment calculation circuit, the dummy pattern misalignment calculation circuit, the height coefficient calculation circuit, and the evaluation pattern misalignment calculation circuit. As a result, the height coefficient h used for measuring the evaluation pattern can be calculated by using the monitor pattern and the dummy pattern provided in a region other than the circuit region. Further, by correcting the measurement result of the evaluation pattern using the SEM image data with the height coefficient h, the misalignment of the evaluation pattern can be measured. That is, the misalignment amount can be calculated from the SEM image data of the evaluation pattern. Since the evaluation pattern can be directly measured and the misalignment amount thereof can be calculated, misalignment measurement accuracy can be improved.

Further, in the configuration according to the present embodiment, since the evaluation pattern can be directly measured, an arbitrary location of the circuit region can be selected according to the situation. Therefore, a variation in the misalignment amount in the chip surface can be calculated more accurately.

Furthermore, in the configuration according to the present embodiment, since the monitor pattern and the dummy pattern can be formed in a region other than the circuit region, it is not necessary to manufacture a reticle dedicated to the monitor pattern, and the reticle manufacturing cost and time and the wafer discarding cost due to the manufacturing of the monitor pattern can be reduced. Therefore, the product development cost and development period can be reduced.

6. Modifications and Like

According to the embodiment described above, the misalignment measuring apparatus capable of improving the misalignment measurement accuracy is provided.

Note that the embodiment is not limited to the form described above, and various modifications can be made.

For example, in the embodiment, the misalignment amount SF1 in the monitor pattern MP is calculated using the surface observation image by the SEM, but the present disclosure is not limited thereto. For example, a cross-section observation of the monitor pattern MP may be performed, and the misalignment amount SF1 may be calculated from a result thereof. Further, when the misalignment amount is calculated from the cross-section observation of the monitor pattern MP, the upper layer pattern UP1 may have substantially the same shape as the evaluation pattern UP0.

Further, in the embodiment, the case where two patterns are stacked has been described, but three or more patterns may be stacked. In this case, a misalignment amount between the pattern of the uppermost layer and the pattern of the second layer from the uppermost layer can be measured.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A misalignment measuring apparatus that measures a first misalignment amount between a first pattern and a second pattern formed on the first pattern, the misalignment measuring apparatus comprising:
    an input circuit configured to receive an image;
    a storage medium configured to store the image;
    a first circuit configured to, in a first calibration pattern including a third pattern corresponding to the first pattern and a fourth pattern formed on the third pattern, calculate a second misalignment amount between the third pattern and the fourth pattern;
    a second circuit configured to, using a first image of a second calibration pattern including a fifth pattern corresponding to the first pattern and a sixth pattern formed on the fifth pattern and corresponding to the second pattern, calculate a first center position of a first contour based on a first threshold corresponding to the fifth pattern and a second center position of a second contour based on a second threshold corresponding to the fifth pattern, and calculate a third misalignment amount between the first center position and the second center position;
    a third circuit configured to calculate a coefficient indicating a relation between the second misalignment amount and the third misalignment amount; and
    a fourth circuit configured to, using a second image corresponding to the first and second patterns, calculate a third center position of a third contour based on a third threshold corresponding to the first pattern and a fourth center position of a fourth contour based on a fourth threshold corresponding to the first pattern, calculate a fourth misalignment amount between the third center position and the fourth center position, and calculate the first misalignment amount between the first pattern and the second pattern based on the fourth misalignment amount and the coefficient.

2. The misalignment measuring apparatus according to claim 1, wherein
    the first circuit is configured to, using a third image of the first calibration pattern, calculate a fifth center position of a fifth contour based on a fifth threshold corresponding to the third pattern and a sixth center position of a sixth contour based on a sixth threshold corresponding to the fourth pattern, and calculate the second misalignment amount between the fifth center position and the sixth center position.

3. The misalignment measuring apparatus according to claim 2, wherein
    a third height position corresponding to the fifth threshold is higher than a bottom surface of the third pattern and is lower than an opening of the third pattern, and
    a fourth height position corresponding to the sixth threshold is higher than a bottom surface of the fourth pattern and is higher than an opening of the fifth pattern.

4. The misalignment measuring apparatus according to claim 1, wherein
    an area of a bottom surface of the fourth pattern is larger than an area of an opening of the third pattern.

5. The misalignment measuring apparatus according to claim 1, wherein
    the first threshold and the third threshold are the same, and the second threshold and the fourth threshold are the same.

6. The misalignment measuring apparatus according to claim 1, wherein
    the first, third, and fifth patterns have the same shape, and the second and sixth patterns have the same shape.

7. The misalignment measuring apparatus according to claim 1, further comprising:
    an output circuit configured to output the first misalignment amount.

8. The misalignment measuring apparatus according to claim 1, wherein
    the first, third, and fifth patterns are formed on a first layer, and the second, fourth, and sixth patterns are formed on a second layer.

9. The misalignment measuring apparatus according to claim 1, wherein
    an area of a bottom surface of the sixth pattern is smaller than an area of an opening of the fifth pattern.

10. The misalignment measuring apparatus according to claim 1, wherein
    a first height position corresponding to the first threshold is lower than an opening of the fifth pattern and is higher than a second height position corresponding to the second threshold.

11. The misalignment measuring apparatus according to claim 1, wherein
    a brightness of the first threshold is higher than a brightness of the second threshold.

12. The misalignment measuring apparatus according to claim 1, wherein
    the first contour is larger than the second contour.

13. The misalignment measuring apparatus according to claim 1, wherein
the first pattern and the second pattern are hole patterns.

14. A misalignment measuring method for measuring a first misalignment amount between a first pattern and a second pattern formed on the first pattern, the misalignment measuring method comprising:
in a first calibration pattern including a third pattern corresponding to the first pattern and a fourth pattern formed on the third pattern, calculating a second misalignment amount between the third pattern and the fourth pattern;
acquiring a first image of a second calibration pattern including a fifth pattern corresponding to the first pattern and a sixth pattern formed on the fifth pattern and corresponding to the second pattern;
using the first image, calculating a first center position of a first contour based on a first threshold corresponding to the fifth pattern and a second center position of a second contour based on a second threshold corresponding to the fifth pattern;
calculating a third misalignment amount between the first center position and the second center position;
calculating a coefficient indicating a relation between the second misalignment amount and the third misalignment amount;
acquiring a second image corresponding to the first and second patterns;
using the second image, calculating a third center position of a third contour based on a third threshold corresponding to the first pattern and a fourth center position of a fourth contour based on a fourth threshold corresponding to the first pattern;
calculating a fourth misalignment amount between the third center position and the fourth center position; and
calculating the first misalignment amount between the first pattern and the second pattern based on the fourth misalignment amount and the coefficient.

15. The misalignment measuring method according to claim 14, wherein
the calculating the second misalignment amount comprises:
acquiring a third image of the first calibration pattern;
using the third image, calculating a fifth center position of a fifth contour based on a fifth threshold corresponding to the third pattern and a sixth center position of a sixth contour based on a sixth threshold corresponding to the fourth pattern; and
calculating the second misalignment amount between the fifth center position and the sixth center position.

16. The misalignment measuring method according to claim 14, further comprising:
outputting the first misalignment amount.

* * * * *